United States Patent [19]

Loftin et al.

[11] Patent Number: 5,482,553

[45] Date of Patent: Jan. 9, 1996

[54] SYSTEM FOR PIN-POINT APPLICATION OF A REMOVABLE CONFORMAL COATING

[75] Inventors: Joe F. Loftin, Plano, Tex.; James E. Roberson, Hermitage, Tenn.; Wayne A. Wood, Brampton, Canada

[73] Assignee: Illinois Tool Works Inc., Glenview, Ill.

[21] Appl. No.: 252,910

[22] Filed: Jun. 2, 1994

[51] Int. Cl.$^6$ ............................ B05B 7/16; B05B 15/02
[52] U.S. Cl. .................. 118/302; 118/667; 118/682; 239/130; 239/134; 239/142; 239/175
[58] Field of Search ..................... 118/667, 682, 118/302; 239/130, 134, 142, 175; 156/578; 427/96, 425

[56] References Cited

U.S. PATENT DOCUMENTS

| | | | |
|---|---|---|---|
| 3,859,113 | 1/1975 | Horvath et al. | 117/43 |
| 4,261,272 | 4/1981 | Duesher | 112/217 |
| 4,344,571 | 8/1982 | Kundig | 239/130 |
| 4,746,553 | 5/1988 | Crisafulli | 427/397 |
| 4,970,985 | 11/1990 | Slautterback | 118/300 |
| 5,271,953 | 12/1993 | Litteral | 427/8 |

Primary Examiner—Timothy M. McMahon
Assistant Examiner—N. Bhat
Attorney, Agent, or Firm—Schwartz & Weinrieb

[57] ABSTRACT

A system for pin-point injection or application of a viscous, hot-melt conformal coating which is injected or applied onto a surface of an article and is readily removable from the surface to provide a temporary mask to selected areas of the article. The system includes a material supply unit which can accept the coating in at least one of granular, flake, chunk or block form and can heat the coating to transform the coating into a substantially viscous form for pumping out of the unit by a pump member. A heatable hose is also included having first and second opposite ends, the first end being connected for operable communication with the pump member and the hose including a heating element controlled by the supply unit and positioned along the length of the hose for maintaining a desired temperature within an interior of the hose. A pin-point nozzle member is connected to the second end of the hose for dispensing the coating at least onto localized minute areas of the article, the nozzle member including a valve member positioned therein which conducts heat from the hose to the nozzle member to maintain a desired temperature of the adhesive at the point of application and provides a precise cut off of the coating upon demand.

8 Claims, 2 Drawing Sheets

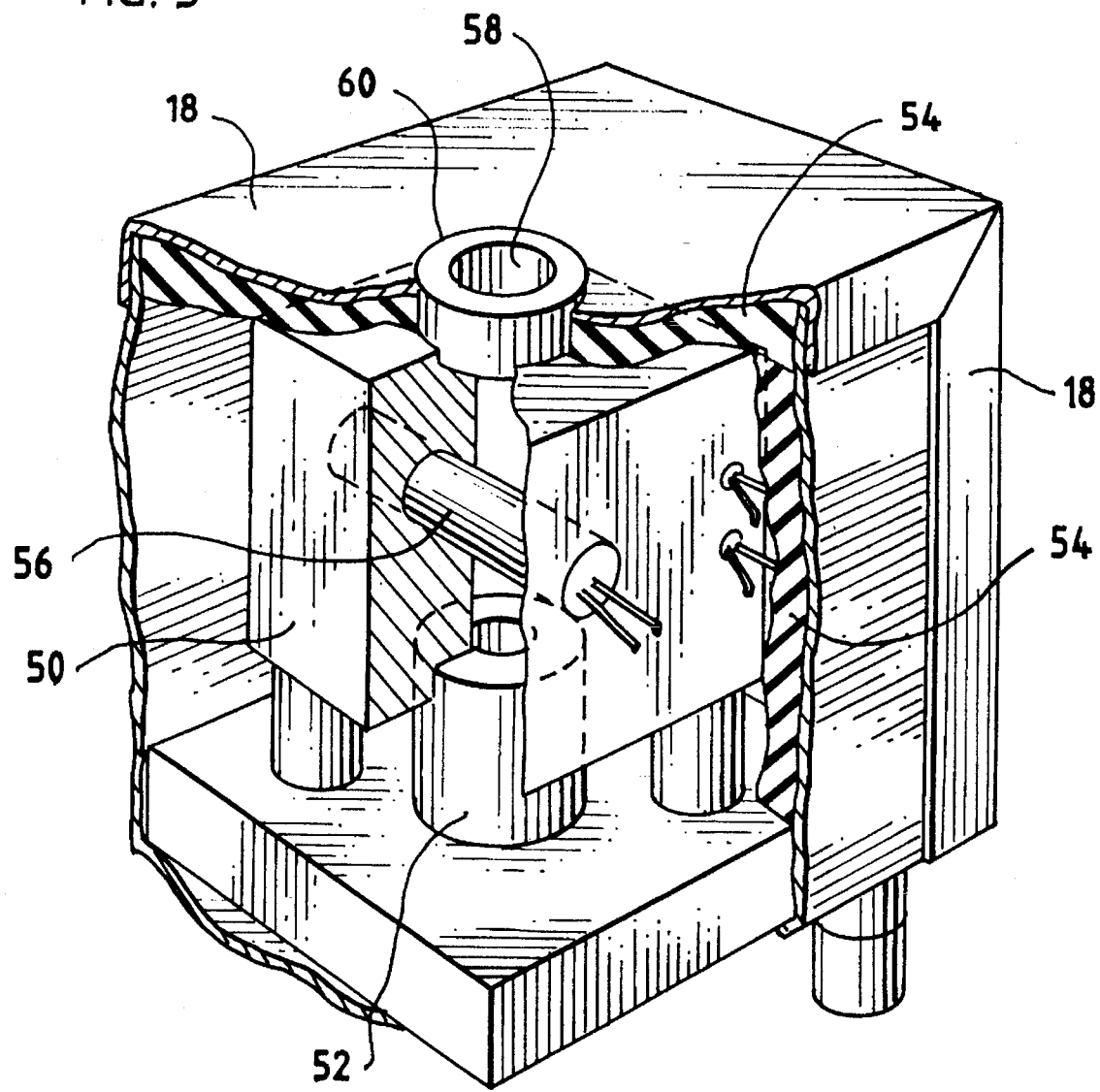

SYSTEM FOR PIN-POINT APPLICATION OF A REMOVABLE CONFORMAL COATING

FIELD OF THE INVENTION

The present invention relates generally to conformal coatings, and more particularly to a system for applying a viscous, hot-melt, removable conformal coating to localized minute areas of an article, such as electrical components of a printed circuit board, where the coating conforms to the surface of the component, cools quickly at room temperature and can be readily removed from the component to provide a temporary mask to the component and enable the printed circuit board to be further processed without damaging or contaminating the masked component.

BACKGROUND OF THE INVENTION

Masking of components and other areas of printed circuit boards is typically desirable to prevent damage and contamination of such components while the board is being further assembled, soldered, stored and/or transported. Existing masking methods include tapes, boots, dies, latex and solvent based masking materials which are applied to the areas to be protected and later removed for final assembly.

With tapes, boots and dies, care must be exercised to ensure that the desired area is properly protected and that such masks will not prematurely fall off during further processing. Solvent based masking materials are not desirable in many applications because of the hazardous emissions of such solvents, typically volatile organic compounds or VOS, and the possible adverse reactions of such solvents with a surface upon which they are deposited.

Hot-melt elastomeric adhesives have also been utilized as masking materials. Such adhesives easily adhere to and release from the surface on which they are deposited without leaving a residue thereon and without increased adhesion over time.

Existing methods of dispensing such adhesives, however, are not very effective in precisely dispensing adhesive onto smaller components. In view of the ever decreasing size of electrical components in many applications, precise dispensing has become a goal in the industry.

Existing systems, however, utilize a cumbersome, large hand gun which does not provide accurate dispensing or precise shut-off of adhesive on demand. Accordingly, proper masking of localized minute areas of a circuit board is simply not possible with these existing systems.

It therefore would be desirable to provide a system for pin-point injection or application of a viscous hot-melt conformal coating to localized minute areas of an article, such as an electrical component of a printed circuit board, which readily conforms to the surface of the component, cools quickly at room temperature and can be readily removed from the component to provide a temporary mask to the component so that the printed circuit board can be processed further without damaging or contaminating the masked component.

SUMMARY OF THE INVENTION

The present invention provides a system for pin-point injection or application of a viscous, hot-melt conformal coating which is injected or applied onto a surface of an article, cools at room temperature and is readily removable from the surface of the article to provide a temporary mask to selected areas of the article.

The system includes a material supply unit which can accept the coating in at least one of granular, flake, chunk or block form and can heat the coating to transform the coating into a substantially viscous form for pumping out of the unit by a pump member.

A heatable hose is also included having first and second opposite ends, the first end being connected for operable communication with the pump member. The hose also includes a heating element controlled by the supply unit and positioned along the length of the hose for maintaining a desired temperature within the interior of the hose.

A pin-point nozzle member is connected to the second end of the hose for dispensing the coating at least onto localized minute areas of the surface. The nozzle member includes a valve member positioned therein which conducts heat from the hose to the nozzle member to maintain a desired temperature of the adhesive at the point of application and provides a precise cut off of the coating upon demand.

BRIEF DESCRIPTION OF THE DRAWINGS

Various other objects, features, and attendant advantages of the present invention will be more fully appreciated from the following detailed description when considered in connection with the accompanying drawings in which like reference characters designate like or corresponding parts throughout the several views, and wherein:

FIG. 3 is a perspective view, in partial section, of a nozzle heater box of the invention.

DESCRIPTION OF THE PREFERRED EMBODIMENTS

Figure 1:
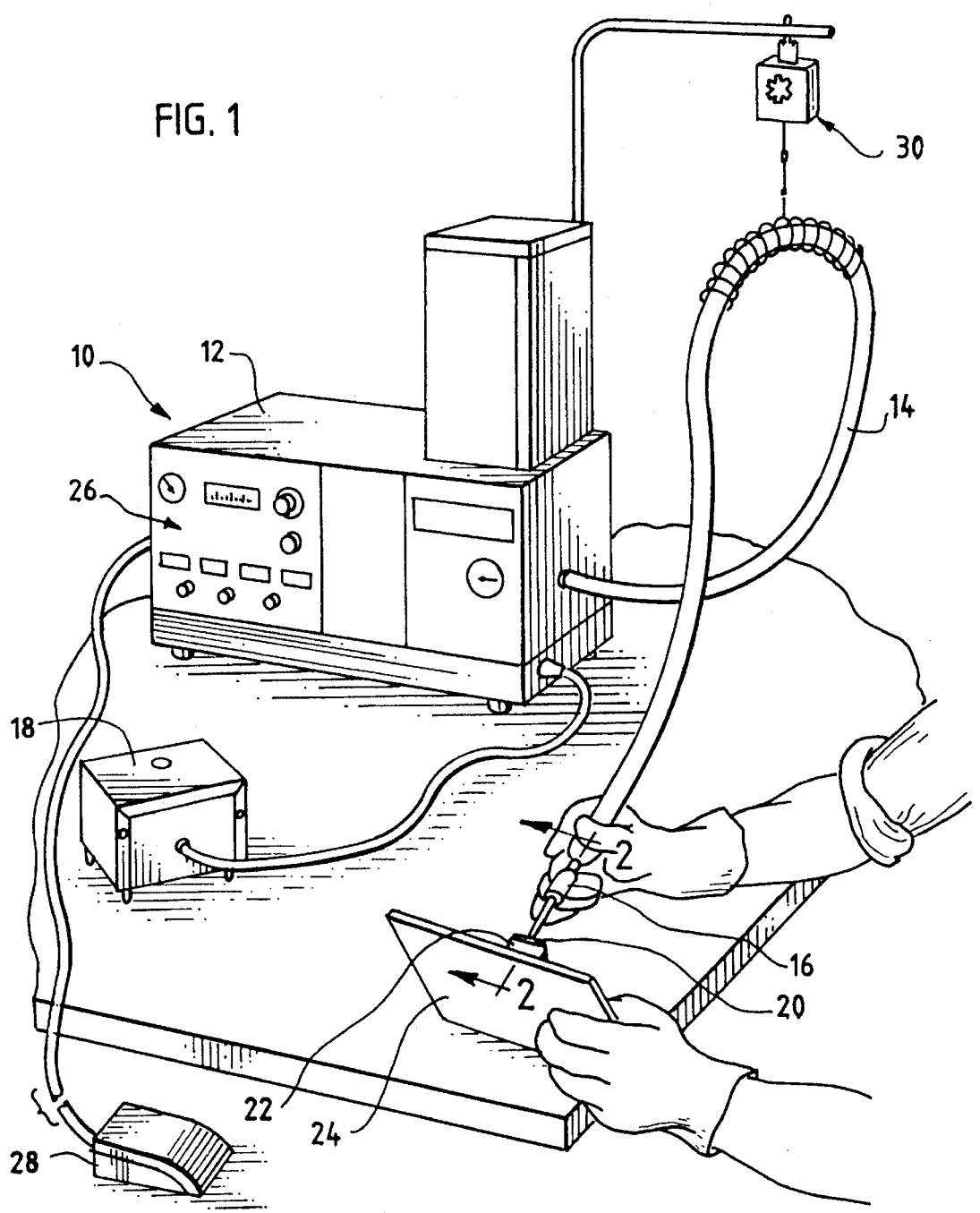
FIG. 1 is a perspective view of the system of the invention.

Referring to FIG. 1, the system of the present invention is generally designated by the reference numeral 10. The system 10 substantially includes a material dispensing unit 12, a heatable hose 14, a pin-point injection nozzle 16 and a nozzle heater box 18.

Briefly, in use, the system 10 is preferably utilized for dispensing a hot-melt adhesive 20 upon an electrical component 22 of a printed circuit board 24. The adhesive 20 thus conforms to the surface of the electrical component 22 and masks the electrical component 22 during further processing of the board 24, such as assembly, soldering, shipping and handling.

When the board 24 is complete and ready for final assembly in a device, the adhesive 20 can be peeled off the electrical component 22. No residue remains on the electrical component 22 and the strength of the adhesive 20 does not increase over time. The hot-melt adhesive 20 does not contain any hazardous ingredients and is preferably a synthetic resin. Details of the system 10 will now be provided.

The material dispensing unit 12 includes a heated adhesive reservoir or hopper and a pump (not illustrated) and provides adhesive 20 in a viscous form to the hose 14 and is activated directly and solely from a control panel 26. Such existing material dispensing units 12 are sold by ITW Dynatec, Hendersonville, Tenn., as part of their hot melt adhesive conformal coating application systems.

In the present invention, to activate the material dispensing unit 12 and provide hands-free operation, a foot switch 28 is included. The control panel 26 includes a plurality of gauges, switches and indicator lights, at least one system power switch and an initial clutch activation switch. Once the system power and initial clutch activation switch are turned on, the foot switch 28 can be utilized to provide precise dispensing of adhesive 20 while leaving the operator's hands free to position the nozzle 16 as desired.

Preferably, the pump of the material dispensing unit 12 of the present invention is driven by a motor through an air clutch (not illustrated). The air clutch is controlled by a compressed air supply line which is activated by a solenoid which in turn is activated by the foot switch 28. Once the main power to the material dispensing unit 12 is turned on and the unit has reached operation temperature, the motor is continuously running. The initial clutch activation switch must be depressed to allow the foot switch to activate the solenoid. Upon depressing the foot switch 28, the solenoid opens the compressed air line to actually engage the clutch and rotate the pump.

The pump supplies adhesive 20 within the hose 14 at a desired pressure which opens a valve in the nozzle 16 as described below. Upon release of the foot switch 28, the clutch is disengaged and pressure within the hose 14 decreases causing substantially instantaneous closing of the valve within nozzle 16 which provides a precise cut-off of adhesive 20.

The hose 14 is preferably a heated, insulated hose and is connected to the material dispensing unit 12 to receive adhesive 20 and power for the hose heater (not illustrated). The hose 14 is preferably charged or filled with adhesive 20 before use to enable the precise application of adhesive as described below. To assist in positioning and handling of the hose 14, a hose balancer support assembly 30 can be included.

Figure 2:
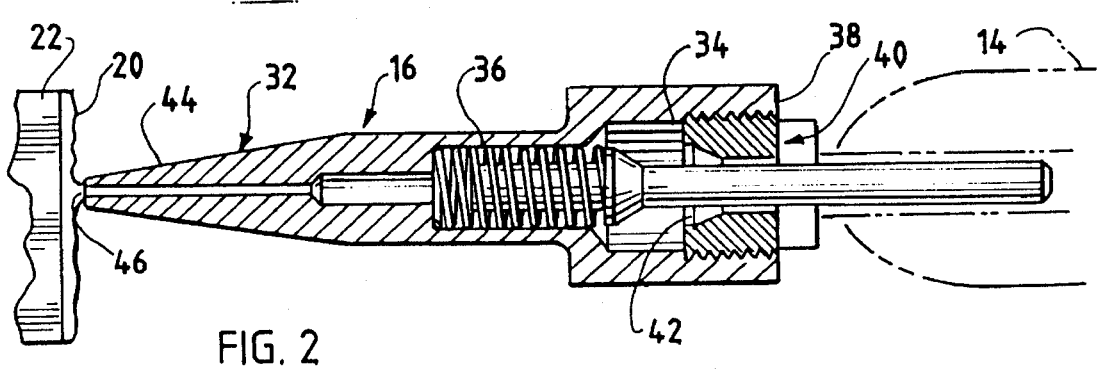
FIG. 2 is a cross-sectional view of a pin-point nozzle member of the invention taken along line 2—2 of FIG. 1.

The nozzle member 16 is designed for pin-point application of the adhesive 20 to selected minute areas of the printed circuit board 24. As FIG. 2 illustrates, the nozzle 16 substantially includes a pen nozzle tip 32, a shut-off stem 34 and a spring 36.

To receive and control adhesive 20 from the hose 14, the nozzle tip 32 includes a first end 38 for threaded engagement with a hose fitting 40 having a valve seat 42 formed therewith. To provide pin-point dispensing of adhesive 20, the nozzle tip 32 includes a second opposite end 44 formed substantially to a point and including a fine adhesive outlet 46.

In order to provide a substantially instantaneous cut off of the flow of adhesive 20 upon release of the foot switch 28, the spring 36 biases the stem 34 against the valve seat 42 of the fitting 40 when pressure from the material dispensing unit 12 falls below a specific amount. When the foot switch 28 is depressed, the pressure is increased to a desired level thereby moving the stem 34 to the position illustrated in FIG. 2 and opening the valve seat 42 to initiate the flow of adhesive 20.

This provides a much more precise cut off of adhesive flow from the fine adhesive outlet 46 thereby enabling more precise application. Additionally, since a portion of the stem 34 is positioned within the heated hose 14, the stem 34 conducts heat to the nozzle 16 to assist in maintaining the desired temperature of the adhesive 20 and improve its application.

As FIG. 3 illustrates, the heater box 18 substantially includes an outer shell 48, an inner heater member 50 and a drain tube 52. In order to insulate the outer shell 48, a layer of insulation 54 can also be included on one or more surfaces of the shell 48.

To heat the heater member 50, one or more heater rods 56 are positioned therein. To hold the nozzle 16 within the heater member 50, the heater member 50 includes a central bore 58 therethrough which terminates in the drain tube 52 on one end and a top washer 60 on the other outside end. The drain tube 52 can accommodate any excess adhesive 20 that may flow out of the nozzle 16 over time.

In use, the system is turned on and takes approximately thirty minutes to heat to the proper temperature. An operator removes the nozzle 16 from the central bore 58 of the heater member 50 which maintains the nozzle 16 at a desired temperature to prevent clogging. The foot switch 28 is depressed to initiate the pump and provide a flow of adhesive 20 from the material dispensing unit 12 through the hose 14 and out of the nozzle 16.

As adhesive 20 reaches the stem 34, pressure builds up within the hose 14 until the spring force of the spring 36 is overcome to open the fine adhesive outlet 46. At this point, the adhesive 20 can be applied in precise locations on the electrical component 22 or any other portion of the circuit board 24.

When finished, the operator releases the foot switch 28 which simultaneously reduces the pressure within the hose 14 and causes the spring 36 to close the stem 34 against the valve seat 42. The nozzle 16 is then positioned within the bore 58 of the heater member 50 which is provided power from the material dispensing unit 12 and maintains the nozzle 16 at a desired temperature until further use.

Modifications and variations of the present invention are possible in light of the above teachings. It is to be understood that within the scope of the claims the invention may be practiced other than specifically described.

We claim:

1. A system for pin-point application of a viscous, hot-melt conformal coating which is applied onto a surface of an article and is readily removable from said surface of said article so as to provide a temporary mask to selected areas of said article, comprising:

material supply means for housing coating material in at least one of granular, flake, chunk, or block form, and for heating said coating material so as to transform said coating material into a substantially viscous form for pumping out of said supply means by a pump member;

a heatable hose having first and second opposite ends wherein said first end is operatively connected to said pump member, said hose including a heating element controlled by said supply means and positioned along the length of said hose for maintaining a desired temperature within the interior of said hose; and a pin-point nozzle member connected to said second end of said hose for dispensing said coating material onto localized minute areas of said article, said nozzle member including a valve member positioned within said nozzle member and extending into said second end of said hose so as to conduct heat from said hose to said nozzle member so as to maintain a desired temperature of said coating material at the point of application, and for providing a precise cut-off of said coating material upon demand.

2. The system as defined in claim 1 wherein said material supply means is controlled by a foot switch so as to enable a user's hands to be free to more easily apply said coating material as desired.

3. The system as defined in claim 1 wherein said pump is driven by a motor connected thereto by an air clutch, said motor running continuously upon initially turning on the power to said material supply means and said material supply means reaching its operation temperature, said air clutch being connected to a compressed air supply line controlled by an initial clutch activation switch and a solenoid, said solenoid being controlled by a foot switch which, when depressed, activates said solenoid so as to engage said clutch to said motor, rotate said pump so as to pressurize said hose, and open said valve member so as to enable dispensing of said coating material, while release of said foot switch deactivates said solenoid, disengages said clutch, stops said pump, depressurizes said hose, and substantially instantaneously activates said valve member so as to shut off the flow of said coating material.

4. The system as defined in claim 1 including a nozzle heater box in operable communication with said material supply means for accepting, holding, and heating said nozzle member during non-dispensing periods.

5. The system as defined in claim 4 wherein said nozzle heater box includes a drain tube for accumulation of any excess adhesive that may be emitted from said nozzle while held in said nozzle heater box.

6. The system as defined in claim 1 wherein said valve member includes a valve stem and a spring, said valve stem being biased to a closed position against a valve seat in the absence of a predetermined pressure within said hose and being opened upon providing said predetermined pressure within said hose so as to dispense said coating material.

7. The system as set forth in claim 1, wherein:

said coating material comprises a hot-melt adhesive.

8. The system as set forth in claim 1, wherein:

said article comprises an electrical component of a printed circuit board.

\* \* \* \* \*